US005346861A

United States Patent [19]
Khandros et al.

[11] Patent Number: 5,346,861
[45] Date of Patent: Sep. 13, 1994

[54] SEMICONDUCTOR CHIP ASSEMBLIES AND METHODS OF MAKING SAME

[75] Inventors: Igor Y. Khandros, Peekskill; Thomas H. DiStefano, Bronxville, both of N.Y.

[73] Assignee: Tessera, Inc., Elmsford, N.Y.

[21] Appl. No.: 865,984

[22] Filed: Apr. 9, 1992

Related U.S. Application Data

[62] Division of Ser. No. 586,758, Sep. 24, 1990, Pat. No. 5,148,266.

[51] Int. Cl.$^5$ ............................................. H01L 21/60
[52] U.S. Cl. .................................. 437/209; 437/211; 437/215; 437/217; 437/220
[58] Field of Search ............... 437/209, 211, 215, 217, 437/220; 357/70, 74, 80

[56] References Cited

U.S. PATENT DOCUMENTS

| | | |
|---|---|---|
| 3,302,067 | 1/1967 | Jackson et al. . |
| 3,390,308 | 3/1966 | Marley . |
| 3,426,252 | 2/1969 | Lepselter ........................ 357/74 |
| 3,474,297 | 10/1969 | Bylander . |
| 3,487,541 | 1/1970 | Boswell . |
| 3,614,832 | 10/1971 | Chance et al. ................... 357/74 |
| 3,680,037 | 7/1972 | Nellis . |
| 3,680,206 | 8/1972 | Roberts ........................... 357/80 |
| 3,683,105 | 8/1972 | Shamash et al. . |
| 3,772,575 | 11/1973 | Hegarty et al. ................. 357/80 |
| 3,795,037 | 3/1974 | Luttmer . |
| 3,832,769 | 9/1974 | Olyphant, Jr. et al. . |
| 3,862,790 | 1/1975 | Davies et al. . |
| 3,864,728 | 2/1975 | Peltz et al. . |
| 3,868,724 | 2/1975 | Perrino ............................ 357/80 |
| 4,179,802 | 12/1979 | Joshi . |
| 4,189,825 | 2/1980 | Robillard et al. . |
| 4,237,607 | 12/1980 | Ohno . |
| 4,356,374 | 10/1982 | Noyori et al. .................. 219/121 |
| 4,410,905 | 10/1983 | Grabbe . |
| 4,545,610 | 10/1985 | Lakritz et al. . |
| 4,574,470 | 3/1986 | Burt . |
| 4,604,644 | 8/1986 | Beckham et al. . |

(List continued on next page.)

FOREIGN PATENT DOCUMENTS

| | | |
|---|---|---|
| 072673 | 8/1982 | European Pat. Off. . |
| 080041 | 9/1982 | European Pat. Off. . |
| 413451 | 7/1990 | European Pat. Off. . |
| 2495839 | 12/1981 | France . |
| 8910005 | 10/1989 | PCT Int'l Appl. . |
| 89/12911 | 12/1989 | PCT Int'l Appl. . |
| 9112706 | 8/1991 | PCT Int'l Appl. . |
| 1003396 | 8/1983 | U.S.S.R. . |

OTHER PUBLICATIONS

IBM Technical Disclosure Bulletin entitled "Non-Permanent Mounting Technique For Test and Burn-In of C4 Devices", Nov. 1990, vol. 33, No. 7.
IBM Technical Disclosure Bulletin, entitled "Extended Pad For Testing Package Parts", Dec. 1984, vol. 27, No. 7B.
IBM Technical Disclosure Bulletin entitled "Test And Repair of direct Chip Attach Modules", Aug. 1988, vol. 31, No. 3.
Microelectronics Packaging Handbook, Rao R. Tummala and Eugen J. Rymaszewski, 1989, pp. 420–423 and 1132.

Primary Examiner—Tom Thomas
Assistant Examiner—Kevin M. Picardat
Attorney, Agent, or Firm—Lerner, David, Littenberg, Krumholz & Mentlik

[57] ABSTRACT

A semiconductor chip assembly is mounted to contact pads in a compact area array. An interposer is disposed between the chip and the substrate. The contacts on the chip are connected to terminals on the interposer by flexible leads extending through apertures in the interposer. The terminals on the interposer in turn are bonded to the contact pads on the substrate. Flexibility of the leads permits relative movement of the contacts on the chip relative to the terminals and the contact pads of the substrate and hence relieves the stresses caused by differential thermal expansion. The arrangement provides a compact structure similar to that achieved through flip-chip bonding, but with markedly increased resistance to thermal cycling damage.

21 Claims, 8 Drawing Sheets

U.S. PATENT DOCUMENTS

| | | |
|---|---|---|
| 4,627,151 | 12/1986 | Mulholland et al. . |
| 4,628,406 | 12/1986 | Smith et al. . |
| 4,670,770 | 6/1987 | Tai . |
| 4,681,654 | 7/1987 | Clementi et al. . |
| 4,685,998 | 8/1987 | Quinn et al. . |
| 4,709,468 | 12/1987 | Wilson . |
| 4,710,798 | 12/1987 | Marcantonio . |
| 4,721,993 | 1/1988 | Walter . |
| 4,751,199 | 6/1988 | Phy . |
| 4,751,482 | 6/1988 | Fukuta et al. ............ 357/74 |
| 4,764,804 | 8/1988 | Sahara et al. ............ 437/215 |
| 4,772,936 | 9/1988 | Reding et al. . |
| 4,793,814 | 12/1988 | Zifcak et al. . |
| 4,796,078 | 2/1989 | Phelps, Jr. et al. . |
| 4,811,082 | 3/1989 | Jacobs ............ 357/74 |
| 4,814,295 | 3/1989 | Mehta . |
| 4,818,728 | 4/1989 | Rai et al. ............ 437/209 |
| 4,855,867 | 8/1989 | Gazdik . |
| 4,874,721 | 10/1989 | Kimura et al. . |
| 4,878,098 | 10/1989 | Saito et al. ............ 357/80 |
| 4,884,122 | 11/1989 | Eichelberger et al. ............ 357/80 |
| 4,893,172 | 1/1990 | Matsumoto et al. ............ 357/79 |
| 4,918,811 | 4/1990 | Eichelberger ............ 437/209 |
| 4,926,241 | 5/1990 | Carey ............ 357/75 |
| 4,937,203 | 6/1990 | Eichelberger et al. ............ 437/209 |
| 4,941,033 | 7/1990 | Kishida ............ 357/80 |
| 4,942,140 | 7/1990 | Ootsuki et al. ............ 437/211 |
| 4,967,261 | 10/1990 | Niki et al. ............ 357/70 |
| 4,989,069 | 1/1991 | Hawkins ............ 357/74 |
| 5,086,337 | 2/1992 | Noro et al. ............ 357/79 |

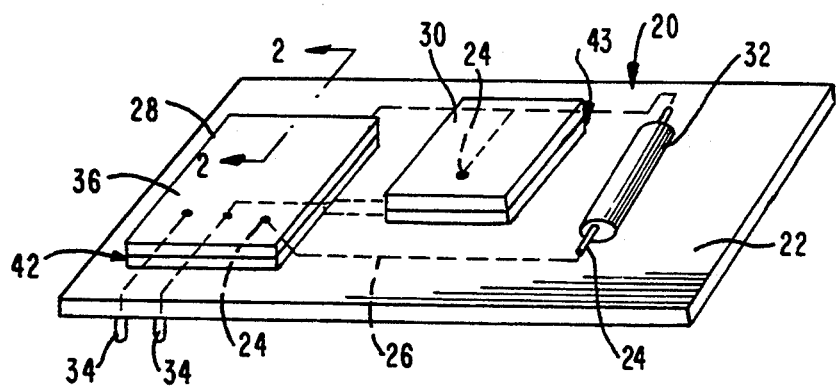
FIG. 1
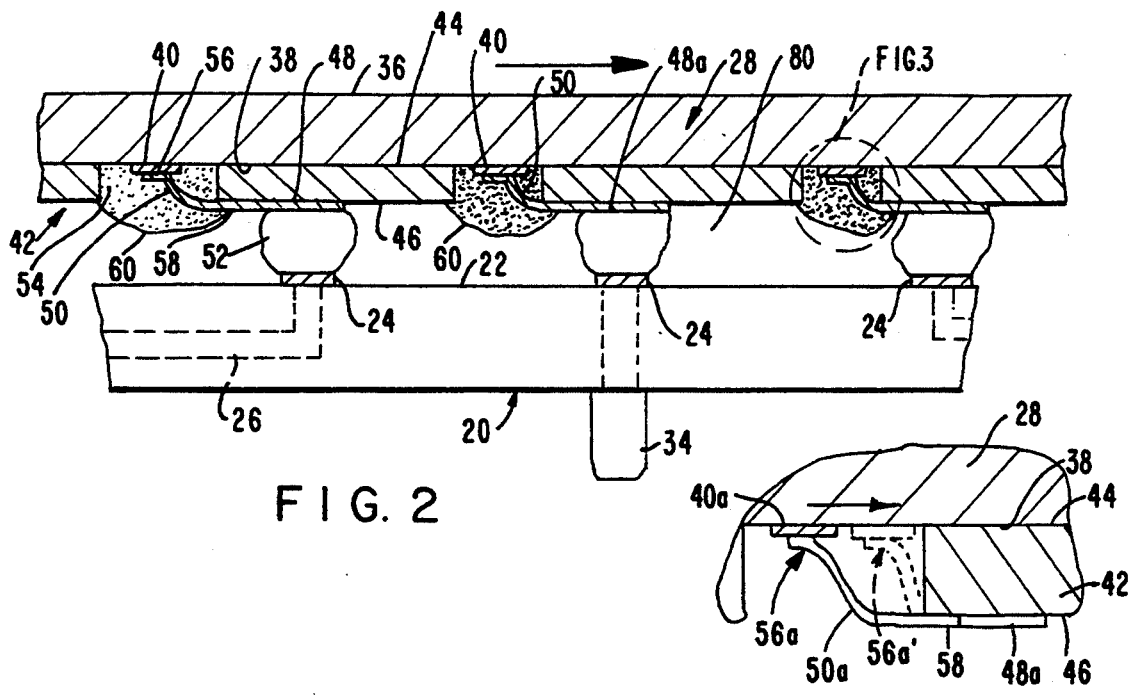
FIG. 2
FIG. 3

SEMICONDUCTOR CHIP ASSEMBLIES AND METHODS OF MAKING SAME

This is a division, of application Ser. No. 07/586,758 filed Sep. 24, 1990 now U.S. Pat. No. 5,148,266.

BACKGROUND OF INVENTION

The present invention relates to the art of electronic packaging, and more specifically to assemblies incorporating semiconductor chips and to methods of making such assemblies.

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the, substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require hundreds or even thousands of I/O connections to a single chip.

The size of the chip and substrate assembly is a major concern. The size of each such assembly influences the size of the overall electronic device. Moreover, the size of each assembly controls the required distance between each chip and other chips, or between each chip or other elements of the circuit. Delays in transmission of electrical signals between chips are directly related to these distances. These delays limit the speed of operation of the device. For example, in a computer where a central processing unit operates cyclically, signals must be interchanged between the central processing unit chip and other chips during each cycle. The transmission delays inherent in such interchanges often limit the clock rate of the central processing chip. Thus, more compact interconnection assemblies, with smaller distances between chips and smaller signal transmission delays can permit faster operation of the central processing chip.

The first level interconnection structures connecting a chip to a substrate ordinarily are subject to substantial stress caused by thermal cycling as temperatures within the device change during operation. The electrical power dissipated within the chip tends to heat the chip and substrate, so that the temperature of the chip and substrate rises each time the device is turned on and falls each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern, The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate.

Wire bonding ordinarily can only be employed with contacts at the periphery of the chip. It is difficult or impossible to make connections with contacts at the center of the front surface of the chip using the wire bonding approach. Also, the contacts on the chip must be spaced at least about 100 micrometers apart from one another. These considerations limit the wire bonding approach to chips having relatively few I/O connections, typically less than about 250 connections per chip. Moreover, the area of the substrate occupied by the chip, the wires and the contact pads of the substrate is substantially greater than the surface area of the chip itself.

In tape automated bonding, a polymer tape is provided with thin layers of metallic material forming conductors on a first surface of the tape. These conductors are arranged generally in a ring-like pattern and extend generally radially, towards and away from the center of the ring-like pattern. The chip is placed on the tape in a face down arrangement, with contacts on the front surface of the chip confronting the conductors on the first surface of the tape. The contacts on the chip are bonded to the conductors on the tape. Ordinarily, numerous patterns of conductors are arranged along the length of the tape and one chip is bonded to each of these individual patterns, so that the chips, once bonded to the tape, can be advanced through successive work stations by advancing the tape. After each chip is bonded to the metallic conductors constituting one pattern, the chip and the immediately adjacent portions of the pattern are encapsulated and the outermost portions of the metallic conductors are secured to additional leads and to the ultimate substrate. Tape automated bonding can provide the assembly with good resistance to thermal stresses, because the thin metallic leads on the tape surface are quite flexible, and will bend readily upon expansion of the chip without imposing significant stresses at the juncture between the lead and the contact on the chip. However, because the leads utilized in tape automated bonding extend outwardly in a radial, "fan out" pattern from the chip, the assembly necessarily is much larger than the chip itself. Also, the leads ordinarily are connected only to contacts at the periphery of the chip. This limits tape automated bonding to chips having relatively low numbers of contacts.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it is difficult to test and operate or "burn-in" chips having an area array of contacts before attaching the chip to the substrate.

Thus, despite all of the effort which has been devoted to development of semiconductor chip assemblies and assembly methods heretofore, there are considerable unmet needs for further improvements.

SUMMARY OF THE INVENTION

The present invention addresses these needs.

One aspect of the present invention provides a semiconductor chip assembly. A chip assembly according to this aspect of the invention includes a semiconductor chip having a front surface with a plurality of contacts disposed in a pattern on the front surface. The pattern of contacts on the front surface encompasses an area, referred to herein as the "contact pattern area" on the front surface. The chip assembly according to this aspect of the invention also includes a sheetlike dielectric interposer overlying the front surface of the chip. The interposer has a first surface facing toward the chip and a second surface facing away from the chip. An area of the interposer overlies the contact pattern area of the chip. The interposer has apertures extending through it, from the first surface to the second surface. The interposer also has a plurality of electrically conductive terminals disposed in a pattern on the second surface of the interposer. At least some of these terminals, and preferably most or all of these terminals, are disposed within the area of the interposer overlying the contact pattern area on the chip. Each such terminal is associated with one contact on the chip.

The assembly also includes flexible, electrically conductive leads. The leads preferably extend through the apertures in the interposer. Each such lead has a contact end connected to the associated contact of the chip and a terminal end connected to the associated terminal on the second surface of the interposer. The leads and the interposer are constructed and arranged so that the contact ends of the leads are moveable relative to the terminals at least to the extent required to compensate for differential thermal expansion of components. The leads desirably are flexible to permit such movement. Most preferably, the interposer itself is flexible so as to facilitate such movement.

The assembly incorporating the chip, interposer, terminals and leads may be incorporated in a larger assembly including a substrate having a top surface facing toward the second surface of the interposer. A plurality of connection pads preferably are disposed on the top surface of the substrate in an array corresponding to the array of terminals on the second surface of the interposer, so that the pads confront the terminals. Means for bonding the pads on the substrate to the terminals on the interposer may be provided. These means may include masses of solder or other electrically conductive material.

Preferred chip assemblies according to this aspect of the present invention are compact and may be utilized with chips having large numbers of input-output connections. The terminals on the interposer, and the corresponding contact pads on the substrate, desirably are disposed in areas substantially the same size as the contact pattern area on the chip itself. Moreover, the contacts on the chip may be arranged in any pattern, and need not be limited to the periphery of the chip. For example, the contacts on the chip can be distributed evenly over the chip face in a so called "area array". Because the contact end of each lead is moveable with respect to the terminal associated with that lead, stresses caused by thermal cycling are markedly reduced. Movement of the contacts on the chip relative to the contact pads on the substrate, such as that caused by expansion of the chip, is taken up by flexing of the leads and movement of the contact ends of the leads relative to the terminals. The ability to take up substantial relative movement of the chip contacts and substrate contact pads without inducing substantial stresses in the electrical connections allows for use of substrate and chip materials having widely differing coefficients of thermal expansion. Assemblies according to this aspect of the present invention thus provide a unique combination of advantages heretofore unattainable in a single structure.

The flexible leads may be formed integrally with the terminals on the interposer, or else may be separately formed fine wires. The leads desirably are curved to provide increased flexibility. The interposer desirably is a thin, flexible sheet of a polymeric material such as polymide, a fluoropolymer, a thermoplastic polymer or an elastomer. In this arrangement, flexing of the interposer facilitates movement of the contact ends of the leads relative to the terminals and thus contributes to the ability of the assembly to withstand thermal cycling. The assembly may also include a compliant dielectric encapsulant having a low elastic modulus, such as an elastomeric encapsulant, covering the flexible leads in whole or in part. The encapsulant may be provided in the form of a layer, with holes in the encapsulant layer aligned with the terminals on the second surface of the interposer. The bonds between the terminals and the contact pads of the substrate extend through these holes. The encapsulant protects the relatively delicate leads during handling and during service, but does not materially impair the flexibility of the leads or the ability of the leads to take up relative motion of the chip and substrate during thermal expansion.

A further aspect of the present invention provides methods of assembling semiconductor chips to substrates. A method according to this aspect of the present invention preferably includes the steps of assembling a sheet-like dielectric interposer having first and second surfaces to a chip so that a first surface of the interposer confronts the front surface of the chip and a portion of the interposer overlies the contact pattern area encompassed by a pattern of contacts on the front surface of the chip. The method also includes the step of connecting the contacts on the chip to terminals disposed on the second surface of the interposer, facing away from the chip, at least some of the terminals overlying the contact pattern area of the chip. The connecting step preferably is performed by connecting flexible leads so that leads extend between the contacts on the chip and the terminals on the interposer through apertures in the interposer, and so that each such terminal is moveable with respect to the contact connected therewith. The method preferably also includes the steps of assembling a substrate with the assembled interposer and chips so that contact pads on a top surface of the substrate confront the terminals on the interposer, and bonding the terminals to the pads. Preferably, the interposer has the terminals positioned thereon prior to assembly of the interposer to the chip before the interposer is assembled with the chip. The leads may be connected to the contacts on the chip by manipulating the leads through the apertures in the interposer. The terminals on the interposer may be bonded to the contact pads of the substrate by application of a fusible material, such as bumps of solder.

The method most preferably includes the step of testing the assembled chip, interposer, leads and terminals prior to assembly of the substrate with these components. The testing procedure may include operation of the chip for a period sufficient to detect latent defects, commonly referred to as "burn in". The interposer and terminals greatly facilitate the testing process. Temporary connections may be made to the terminals, as by applying electrically conductive probes to the terminals, during the testing procedure. The terminals provide substantial areas for engagement by such probes. Most desirably, the substrate is compliant, so that the terminals can be displaced slightly by the probes. This greatly facilitates engagement of the terminals with multiple or "ganged", probes and particularly with non-compliant probes and thus facilitates the testing operation. The assembly method according to this aspect of the present invention may also include the step of applying an encapsulant to cover at least parts of the flexible leads. Desirably, the encapsulant is applied before assembly of the substrate and before the testing step. The interposer may serve as a carrier for the chip during the test, encapsulation and substrate assembly operations. The preferred processes according to this aspect of the present invention thus provide economical assembly methods.

Still further aspects of the invention provide prefabricated components including an interposer, terminals and leads, and methods of making such components.

These and other objects, features and advantages of the present invention will be more readily apparent from the detailed description of the preferred embodiment set forth below taken in conjunction with the accompanying drawings.

BRIEF DESCRIPTION OF THE DRAWINGS

FIG. 1 is a diagrammatic perspective view of a chip assembly in accordance with one embodiment of the invention.

FIG. 2 is a fragmentary sectional view taken along line 2—2 in FIG. 1.

FIG. 3 is a fragmentary view, on an enlarged scale, of the area indicated in FIG. 2.

Figure 6:
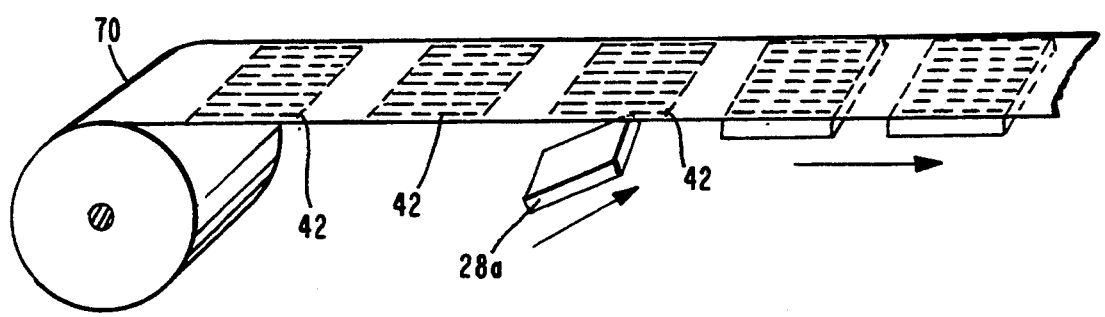
Figure 7:
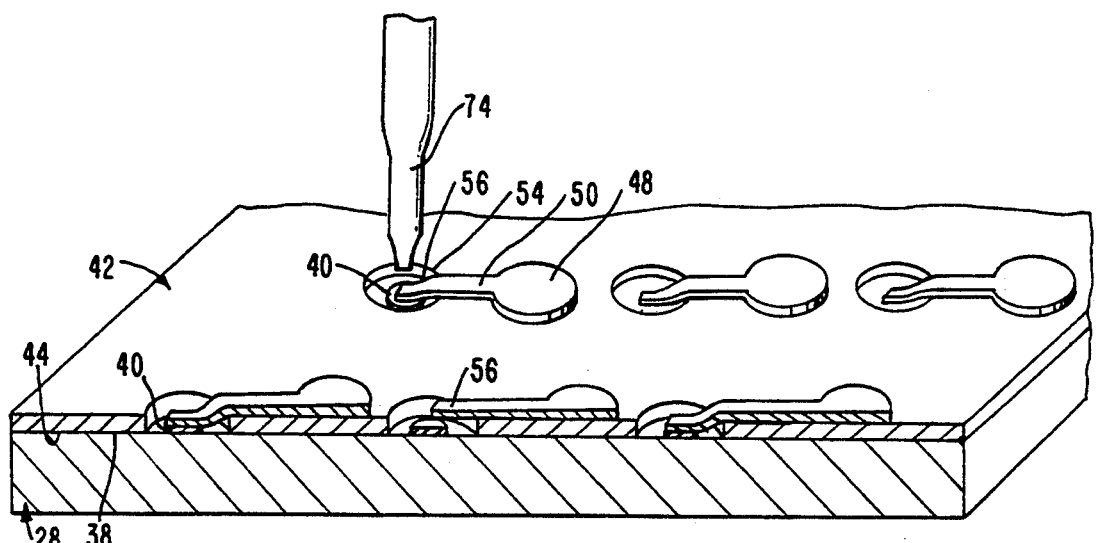
Figure 8:
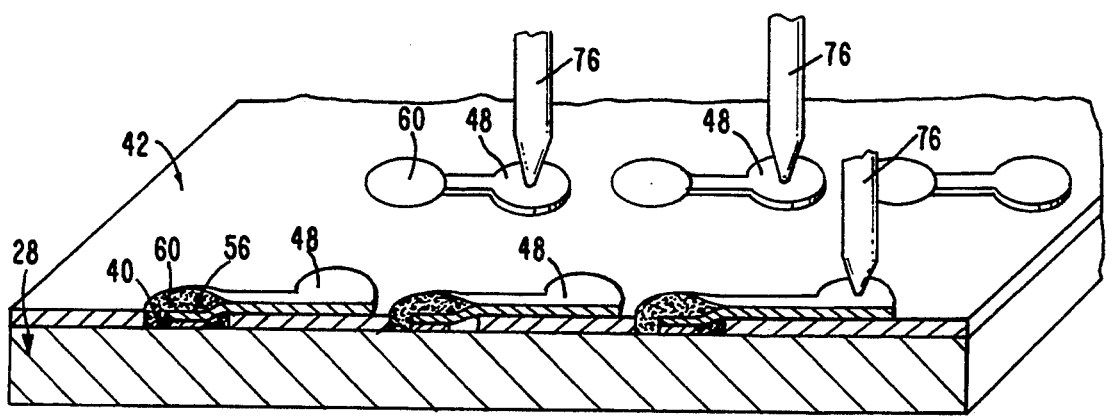

Each of FIGS. 6, 7 and 8 is a fragmentary diagrammatic perspective view depicting certain operations in the process of manufacture of the assembly of FIG. 1.

Figure 9:
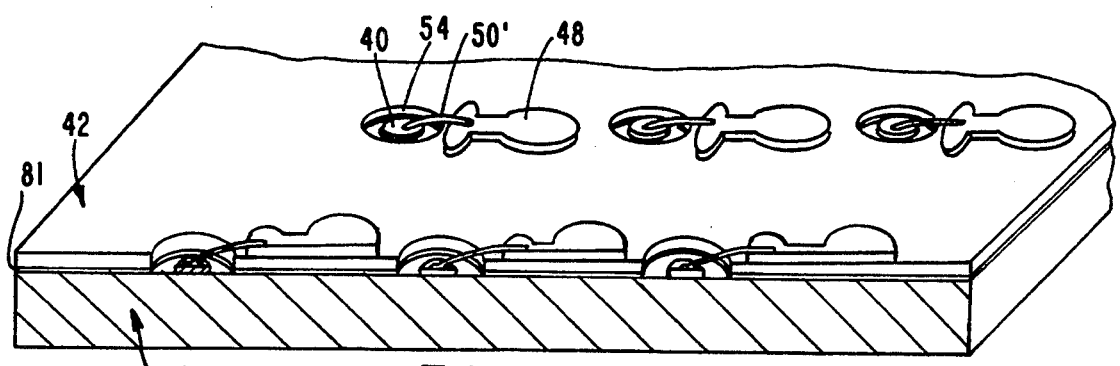

FIG. 9 is a fragmentary diagrammatic perspective view similar to FIG. 7 but depicting components and process steps in accordance with a further embodiment of the invention.

Figure 10:
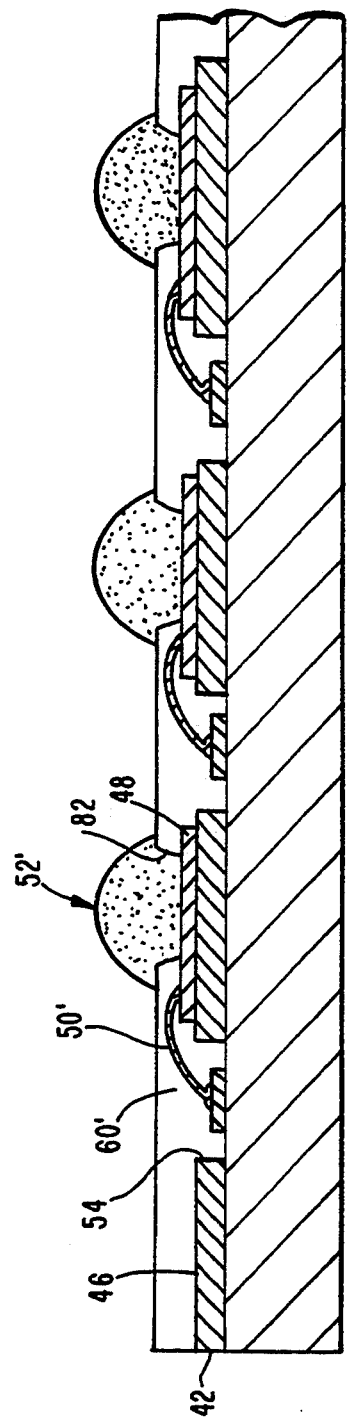

FIG. 10 is a fragmentary sectional view depicting the components of FIG. 9 during a further step in the process.

Figure 4:
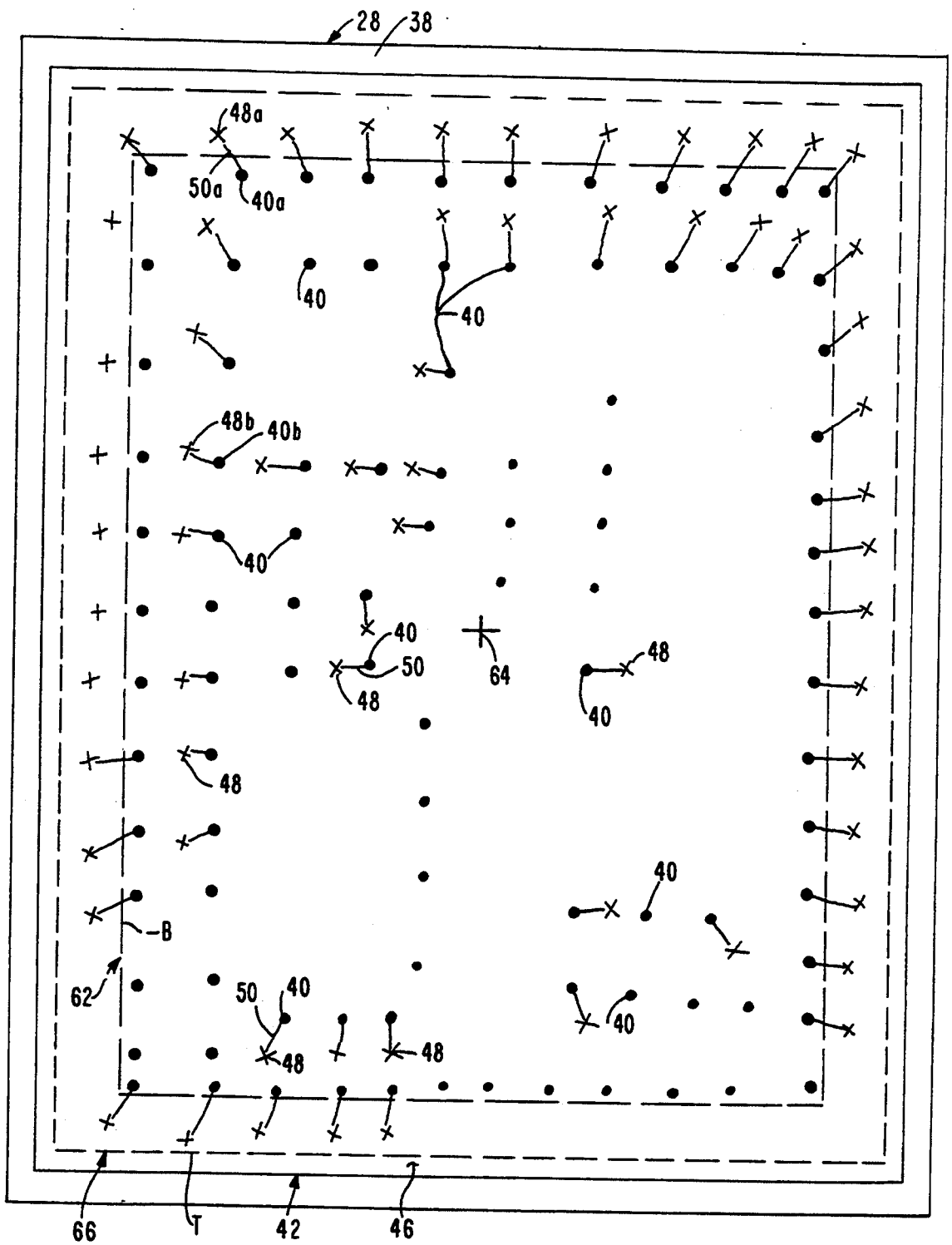
FIG. 4 is a layout diagram depicting the spatial relationship of certain components in the assembly of FIG. 1.
Figure 11:
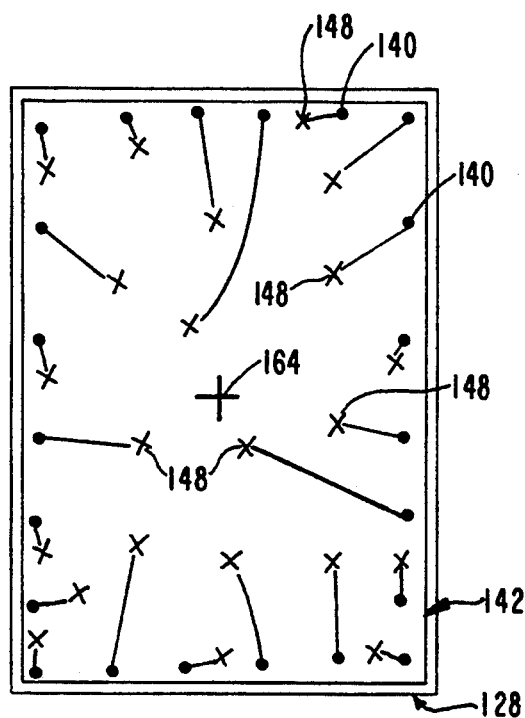

FIG. 11 is a layout diagram similar to FIG. 4 but depicting an assembly in accordance with a further embodiment of the invention.

Figure 12:
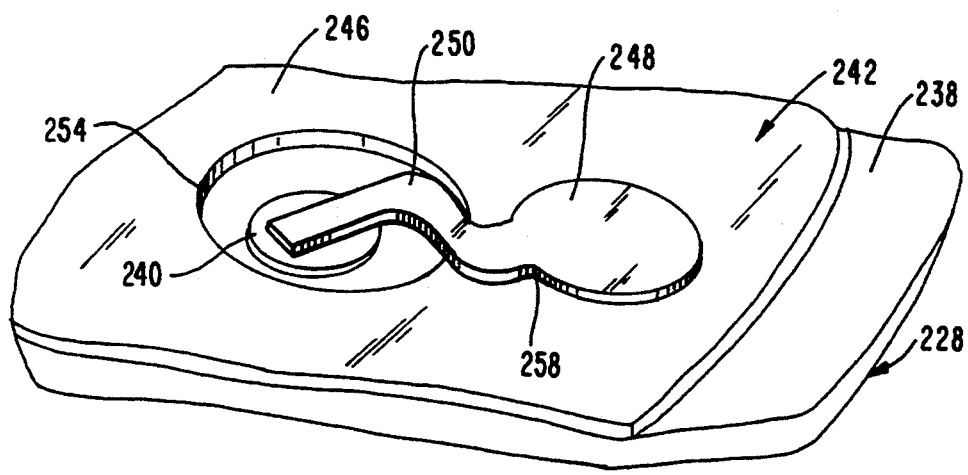

FIG. 12 is a fragmentary diagrammatic perspective view depicting a portion of an assembly in accordance with a further embodiment of the invention.

Each of FIGS. 13A through 13E is a fragmentary diagrammatic perspective view depicting a stage in a further component fabrication process according to the invention.

Figure 14:
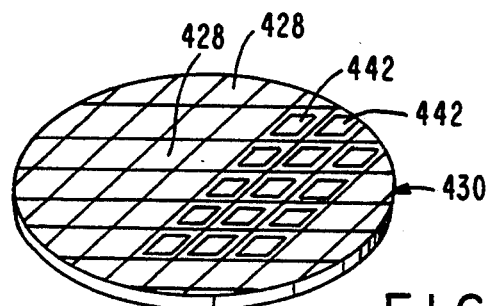
Figure 15:
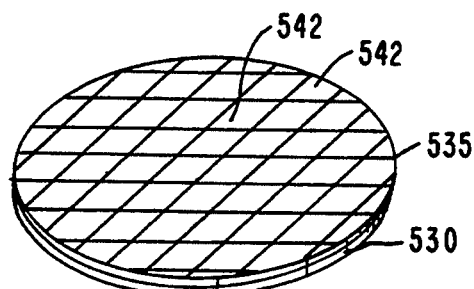
Figure 16:
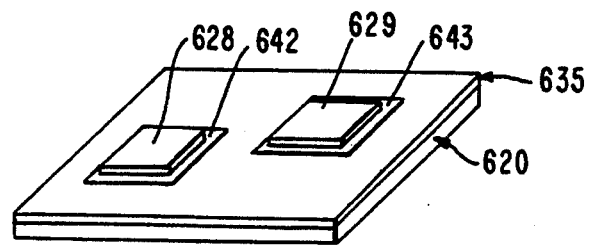

Each of FIGS. 14, 15 and 16 is a diagrammatic perspective view depicting further processes according to the invention.

DETAILED DESCRIPTION OF THE PREFERRED EMBODIMENTS

Each chip assembly in accordance with one embodiment of the present invention includes a rigid substrate 20 having a top surface 22 and having contact pads 24 disposed on the top surface. Substrate 20 is also provided with conductors 26 interconnecting certain ones of the contact pads 24. The contact pads 24 are arranged in a pattern on the top surface of the substrate generally corresponding to the pattern of connections to devices, such as semiconductor chips 28 and 30 and discrete components 32 mounted on the substrate. Substrate 20 also has external connections such as pins 34.

The conductors 26 are arranged to interconnect the various contact pads 24 in the desired patterns so as to interconnect chips 28 and 30 when the same are mounted to the substrate and also to connect these chips to the discrete components 32 and to the external connectors 34 in the appropriate manner for functioning of the particular circuit. Although only a few contact pads 24, conductors 26 and external connections 34 are illustrated in FIG. 1, the substrate 20 may have an unlimited number of contact pads 24, conductors 26 and external connections 34. Hundreds or thousands of these elements typically are provided in each substrate.

Chip 28 has a generally planar rear face 36 and a generally planar front face 38 with electrical contacts 40 (FIG. 2) disposed thereon. The electrical contacts 40 are electrically connected to the internal electronic components (not shown) of chip 28. Chip 28 is mounted on substrate 20 in a front-face-down orientation, with the front face 38 of the chip facing toward the top of face 22 of the substrate. A flexible, sheetlike dielectric interposer 42 is disposed between the chip and the substrate. Interposer 42 has a first generally planar face 44 facing toward chip 28 and a second generally planar face 46 facing in the opposite direction, away from chip 28. Interposer 42 has a plurality of terminals 48 on its second face 46. Each such terminal is associated with one of the contacts 40 on chip 28 and connected to such contact by a flexible lead 50. Each terminal 48 is also associated with one contact pad 24 on substrate 20, and each terminal is bonded to the associated contact pad by a mass 52 of electrically conductive bonding material such as solder or a conductive polymer. Thus, the contacts on chip 40 are interconnected, via leads 50, terminals 48 and masses 52 with the contact pads 24 on the substrate.

Interposer 42 has apertures 54 extending through it, from its first surface 44 to its second face of 46. Each aperture is aligned with one contact 40 on chip 28. Each terminal 48 is disposed adjacent one of the apertures 54. The lead 50 associated with each terminal has a contact end 56 disposed within the associated aperture 54 and connected to the associated contact 40 on the chip. Each lead 50 also has a terminal end 58 connected to the associated terminal 48. In the structure of FIG. 2, the leads 50 are formed integrally with the terminals 48 so that the terminal end 58 of each lead merges with the associated terminal 48. As best seen in FIG. 2, each lead 50 is curved between its contact end 56 and its terminal end 58. The curvature is in the direction perpendicular to the faces 46 and 48 of the interposer. An elastomeric, dielectric encapsulant 60 is disposed in apertures 54 so that the encapsulant covers the contact ends 56 of leads 50 and hence covers the junctures of the leads with the contacts 40.

The contact end 56 of each lead 50 is moveable relative to the associated terminal 48. As best seen in FIG. 3, the contact end 56a of lead 50a can be displaced from its normal, undeformed position (shown in solid lines) in the directions parallel to the faces 44 and 46 of interposer 42 and parallel to the front face 38 of chip 28. For example, the contact end 56a may be displaced to the position indicated in broken lines at 56a'. This displacement is permitted by the flexibility of the lead 50 and by buckling and wrinkling of interposer 42. Encapsulant 60 is compliant, and does not substantially resist flexing of leads 50 and buckling and wrinkling of interposer 42. The displacement illustrated in FIG. 3, from the normal undisplaced position 56a to the displaced position 56a' places the lead 50 in compression. That is, the terminal end 56a moves generally toward the associated terminal 48 in moving from position 56a to position 56a'. Movement in this direction is particularly well accommodated by buckling of the lead 50. The contact end of each lead can also move in other directions, such as in the opposite direction from position 56a away from the associated terminal 48, and in directions perpendicular to these directions, into and out of the plane of the drawing as seen in FIG. 3.

As best seen in FIG. 4, the contacts 40 on chip 28 (each symbolized by a dot in FIG. 4) are disposed in a pattern on the front surface of chip 28. Contacts 40 cooperatively encompass a contact pattern area 62 on the front face of chip 28. The boundary of the contact pattern area is illustrated by a broken line B in FIG. 4. The boundary of the contact pattern area may be taken as the shortest combination of imaginary line segments along the front face of the chip which cooperatively enclose all of the contacts 40. In the particular example illustrated in FIG. 4, this boundary is generally in the form of a rectangle. Contacts 40 are disposed throughout contact pattern area 62, in locations determined by the interior structure of chip 28. Contact pattern area 62 includes a peripheral region, adjacent the boundary B, and a central region, adjacent the geometric center 64 of the contact pattern area. Contacts 40 are disposed both in the peripheral region and in the central region. Typically, although not necessarily, the contacts 40 are disposed at substantially equal spacings throughout the entirety of contact pattern area 62. The terminals 48, each symbolized by a X in FIG. 4, are disposed in a similar pattern on the second surface 46 of interposer 42. At least some of terminals 48 are disposed in the area of interposer surface 46 overlying contact pattern area 62. Terminals 48 encompass a terminal pattern area 66 on the second face 46 of the interposer. The boundary of terminal pattern area 66 is illustrated in FIG. 4 by the broken line T. The boundary of the terminal pattern area may be taken as the shortest combination of imaginary line segments which would cooperatively enclose all of the terminals on the second surface of the interposer. The geometric center of terminal array area 66 desirably is coincident, or approximately coincident, with the geometric center 64 of the contact array area. Desirably, terminal pattern area 66 is not substantially larger than contact pattern area 62. That is, the perimeter of the terminal area preferably is less than about 1.2 times, and most preferably about 1.0 times the perimeter of contact pattern area 62. Stated another way, the outermost terminals 48 desirably lie within or close to the boundary B of contact array area 62. The total area encompassed within terminal pattern area 66 desirably is less than about 1.4 times, and most desirably about 1.0 times the total area encompassed within contact pattern area 62. Thus the leads 50 connecting contacts 48 to terminals 40 do not "fan out", away from the geometric center 64 the contact pattern area. Typically, the mean distance of the terminals 48 from geometric center 64 of the contact pattern area, measured in the direction parallel to the surfaces of the chip and interposer, is less than about 1.1, and typically about 1.0, times the mean distance of the chip contacts 40 from center 64.

Figures 5A, 5B:
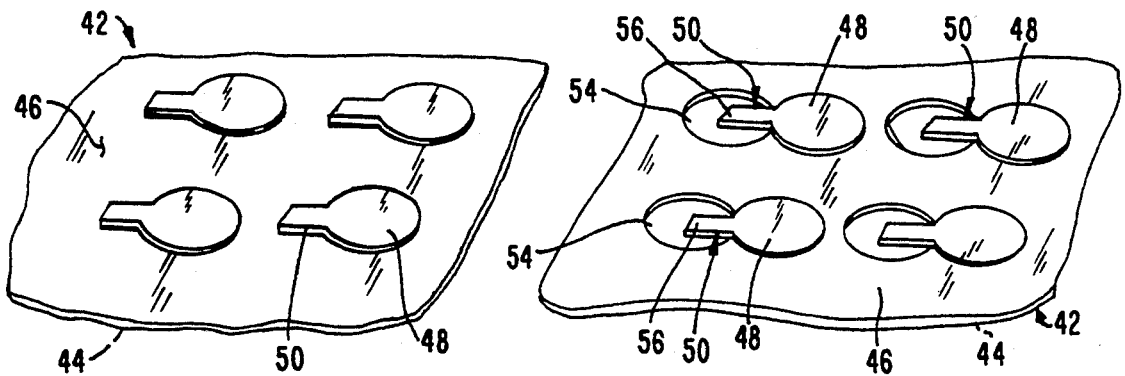
FIGS. 5A and 5B are fragmentary diagrammatic perspective views depicting certain operations, in manufacture of a component utilized in the assembly of FIG. 1.

The interposer and leads utilized in the structure of FIGS. 1–4 may be fabricated by a process as schematically illustrated in FIGS. 5A–5B. In this procedure, the terminals 48 and leads 50 may be deposited on the second surface 46 of the sheetlike interposer by conventional printed circuit manufacturing techniques before formation of apertures 54. Thus, the leads and terminals may be formed either by an additive process, wherein the metal is deposited in the desired pattern by plating, or else in a subtractive process which begins with a laminate including both the sheetlike interposer 42 and a full layer of metal and removes the metal except in the areas where the terminals and leads are desired, so as to yield a sheet having the terminals and leads in position (FIG. 5A). After formation of the terminals and leads, apertures 54 are formed in registration with the contact ends 56 of the leads 50 (FIG. 5B) by etching through the interposer from the first surface 44, or by applying radiant energy such as laser beam focused at the appropriate spots on the first surface 44.

Figure 13A:
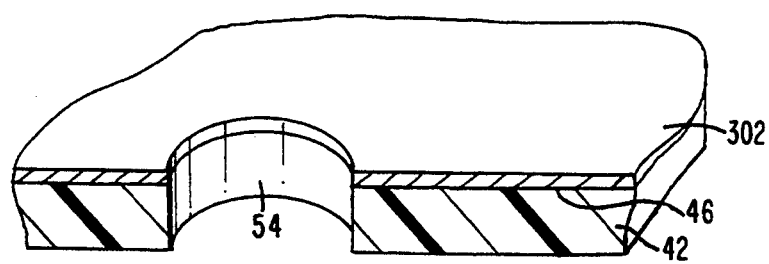
Figure 13B:
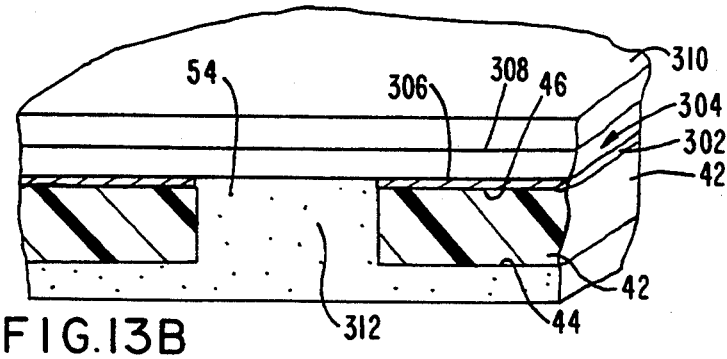

A further method of making a component incorporating the interposer, terminals and leads is shown in FIGS. 13A–13E. In this method, the apertures 54 are formed in interposer 42, and the apertured interposer is provided with a layer 302 of adhesive on the second surface 46 of the interposer. A conductive sheet, such as a sheet of copper 304 is applied on the first surface of the interposer, so that sheet 304 overlies adhesive 302 and so that sheet 304 overlies the apertures 54. A first surface 306 of sheet 304 faces towards interposer 42 and confronts the second surface 46 of the interposer, with the adhesive layer 302 disposed there between. A second surface 308 of the conductive sheet faces away from the interposer. A layer 310 of a photosensitive resist composition is applied on the second surface 308 of conductive layer 304. A second resist composition 312 is placed within apertures 54 so that resist 312 covers the first surface 306 of conductive layer 304 within apertures 54. Desirably, resist 312 is applied by applying a layer of the second resist composition to the first surface 44 of interposer 42 as illustrated in FIG. 13B. Both resist compositions 310 and 312 may be provided as so-called "dry resist" i.e., as a film of resist composition which can be laminated to the other structures. Resist composition 312 is laminated to the first surface 44 of the interposer 42 under pressure so that the resist composition flows into apertures 54 and substantially fills these apertures.

Figure 13C:
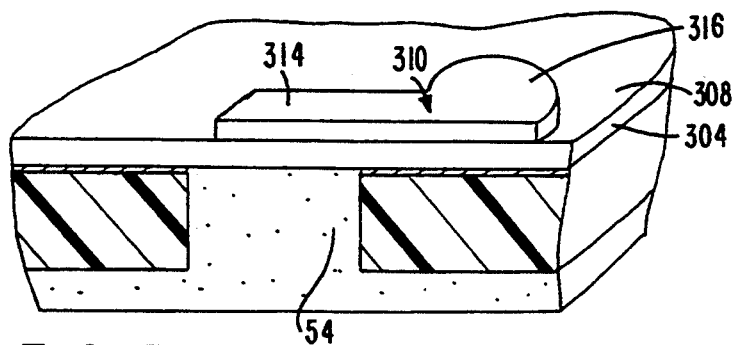

In the next stage of the process, depicted in FIG. 13C, the first resist layer 310 is selectively cured and uncured portions are removed so as to leave the cured resist in a pattern corresponding to the desired pattern of conductive materials in the finished product. Such selective curing and removal of a resist layer may be accomplished by known photographic techniques. The remaining resist pattern on the second surface 308 of the conductive layer 304 includes elongated lead areas 314 and terminal areas 316 contiguous with the lead areas. At least a part of each lead area 314 overlies one of the apertures 54 in the interposer, whereas the terminal areas 316 do not overly the apertures. The portion of each lead area 314 overlying an aperture is smaller than the aperture, so that each lead area overlies only a portion of the associated aperture 54. Desirably, each lead area 54 protrudes lengthwise across the aperture 54, as illustrated in FIG. 13C. The second resist material 312 within apertures 54 desirably also is cured. As the second resist material may be cured in its entirety, and need not be cured selectively in a predetermined pattern, the second resist material may be of a type which can be cured by exposure to heat or other nonselective curing method. Alternatively, the second resist material 312 may be photographically cured.

Figure 13D:
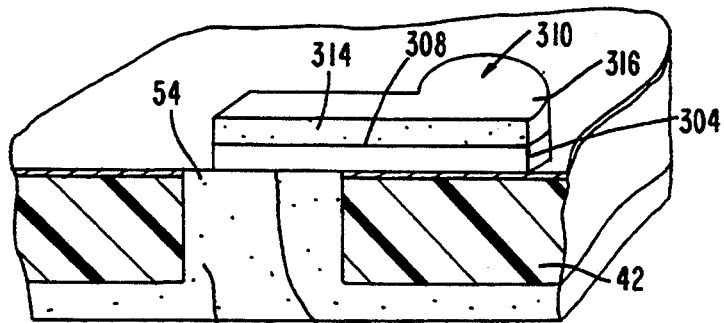
Figure 13E:
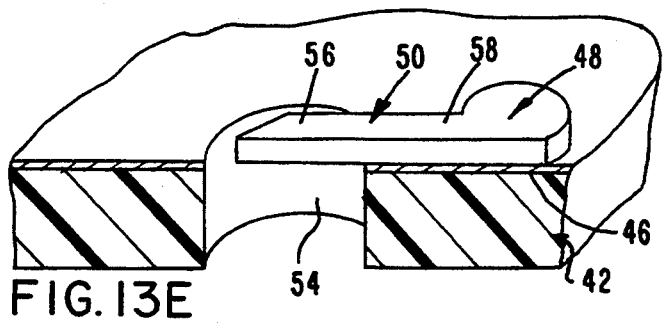

In the next stage of the process, illustrated in FIG. 13D, the assembly is immersed in an etchant capable of dissolving the conductive material in layer 304 so that the etchant contacts this layer. During the etching procedure, the first resist in lead area 314 and terminal areas 316 protects the second surface 308 of conductive layer 304. The interposer 42 protects the first surface 306 of layer 304 in the terminal areas 316 and in those portions of lead areas 314 which do not overly apertures 54. The second resist 312 protects the first surface 306 in those portions of lead areas 314 which overlie apertures 54. The etchant therefore does not attack those portions of conductive layer 304 covered by lead portions 314 and terminal portions 316 of the first resist layer 310. The first resist layer 310 and the second resist 312 are then removed by conventional resist decomposition processes such as exposure to solvents which attack the resist. This leaves the unattacked portions of conductive layer 304 as leads 50 and terminals 48 on the second surface 46 of interposer 42, with a contact end 56 of each lead 50 protruding over the associated aperture 54 and with a terminal end 58 of each lead connected to the associated terminal 48.

This process can be modified. For example, the adhesive layer 302 may be omitted where the conductive layer forms a satisfactory bond to the material of the interposer. Also, the pattern first resist 310 need not be provided by a subtractive process as discussed above but instead may be provided by an additive process, wherein the resist is applied only in the areas to form the pattern, as by silkscreening. Formation of the leads 50 and terminal 48 by this type of etching process is particularly useful in forming fine leads in good registration with apertures 54. Also, as the apertures 54 are preformed, there is no possibility of damaging the leads during formation of the apertures.

The assembly of the interposer and terminals and contacts is fabricated in a substantially continuous sheet or strip. As illustrated in FIG. 6, the interposers may be provided in the form of a continuous tape 70, with plural interposers 42 spaced lengthwise along the tape, each such interposer having terminals 48 and leads 50 thereon. Tape 70 may be in the form of a single sheet of the material employed for the interposers 42, or else may include separate pieces of such material, each constituting one or more interposers, secured to a backing or the like. Tape 70 may have sprocket holes (not shown) or other features such as those commonly utilized on the tapes for tape automated bonding of semiconductor chips.

In an assembly method according to the invention, tape 70 is advanced in a downstream direction (to the right as seen in FIG. 6) and chips 28 are connected to the tape upon assembly of each chip with one interposer 42 and with the associated terminals and leads. The chips are subsequently carried downstream with the tape, through further operations as discussed below.

As best seen in FIG. 7, each interposer, with the terminals 48 and leads 50 thereon, is brought into juxtaposition with a chip 28, and the chip is aligned with the interposer so that each aperture 54 is aligned with one contact 40 of the chip. The interposer 42 and chip 28 are brought together, so that the first face 44 of the interposer bears on the front face 38 of the chip, and the contacts are received in the apertures 54 of the interposer. The back end 56 of each lead 50 initially lies substantially in the plane of the second surface 46 of the interposer. A tool 74 is advanced into engagement with the contact end 56 of each lead so as to deform the contact end 56 downwardly, into the underlying aperture 54 and towards the associated contact 40. Tool 74 may be a substantially conventional thermal bonding tool, thermosonic bonding tool, ultrasonic bonding tool, compression bonding tool, or the like of the types commonly used in tape automated bonding or wire bonding. By advancing the tool 74 into each aperture 54, the contact ends of leads are manipulated within the apertures and bonded to the contacts 40 on the chip. Although only a single tool 74 is depicted in FIG. 7, the bonding operation may be performed in a multiple operation, with many or all of the leads 50 being bonded to the associated contacts at once.

After the contacts and leads have been bonded to one another, the interposer and the chip are advanced to a further station, where the encapsulant 60 is applied within each aperture 54. The encapsulant 60 may be applied dropwise, by conventional drop application equipment. As best seen in FIG. 8, each drop of encapsulant 60 covers the contact end 56 of the associated lead, but leaves the associated contact 48 uncovered. The encapsulant protects the relatively delicate contact ends 56 of the leads and the relatively delicate junctures with the terminals 40. Once the encapsulant has been applied, the assembly of the interposer, leads, terminals and chips is advanced to a testing station. As illustrated in FIG. 8, the assembly, including the chip 28, may be tested. The test may involve connection of the chip, through the terminals 48, to an external electronic test device (not shown). The test device may be arranged to operate the chip under power for an appreciable period so as to "burn-in" the chip and detect any latent defects. Typically, numerous connections should be established to the chip simultaneously. As illustrated in FIG. 8, this may be accomplished by applying probes 76 to terminals 48. Probes 76 may be so called "noncompliant" probes. That is, probes may be arranged to move in unison, in the directions towards and away from the chip 28 (upwardly and downwardly as seen in FIG. 8). The probes 76 are mounted to a common fixture (not shown) so that the vertical position of the probes relative to one another are fixed. This type of "noncompliant" probe array is particularly convenient where the required spacings between probes (the spacings of the terminals 48) are relatively small. However, non-uniformities in the dimensions of the probes 76 and/or in the dimensions of the terminals 48 or chip 28 may cause one or more of the probes 76 to engage the associated terminal 48 before the other probes have engaged their terminals. Desirably, interposer 42 is compliant, so that each terminal 48 can be displaced slightly by the associated probe 76 in the direction toward chip 28. The region of interposer 42 beneath each terminal 48 compresses slightly to accommodate such displacement. This allows all of the probes 76 to engage their associated contacts 48 without imposing excessive loading on any one probe. The terminals 48 may be larger than the contacts on the chip, so as to provide a relatively large area for engagement by each contact 76 and thus accommodate a reasonable amount of misalignment of the contacts in the directions parallel to the faces of the interposer. Because each chip can be tested in this fashion, prior to assembly with the substrate, defects in the chips, in the terminals and leads associated with the interposer and in the bonds between the leads and the chip contacts can be detected before the chip is united with the substrate.

After the testing operation, the chip and interposer are united with the substrate. The chip and interposer assembly is oriented so that the second face of the interposer, and the terminals 48, face the top surface of the substrate, and each terminal 48 confronts one contact pad 24 on substrate. Masses of solder are applied between the confronting terminals 48 and contact pads 24 and melted in a "solder reflow" operation so that the solder forms a solid joint between the contact pad and terminal, and so that the solder masses support the chip and interposer assembly above the substrate 20, in the orientation illustrated in FIG. 2. The solder application and reflow operation may be performed in substantially the same way as the solder application and reflow operation of conventional flip-chip bonding. Thus, the masses of solder may initially be applied to the contact pads 24 of the substrate, before the chip and interposer assembly is united with the substrate. Alternatively, the solder may be applied to the terminals 48 and bonded to the contact pads 24 in the reflow operation. A flux typically is employed in the solder reflow operation. Because the solder masses support the chip and interposer surface assembly above the substrate, there is a gap 80 between the interposer and the substrate. Flux residues may be rinsed out of the assembly by passing a rinsing fluid through this gap.

In an assembly method according to a further embodiment of the invention, the interposer 42 is not provided with leads before the interposer is united with the chip 28. Instead, leads 50' are applied by bonding separately formed pieces of fine wire to the terminals 48 and to the contacts 40 after the interposer is assembled with the chip. Leads 50' are flexible and curved, and arranged to deform as discussed above so that each contact 40, and the associated contact end of the lead 50' can move relative to the associated terminal 48 so as to accommodate thermal expansion. In the embodiment illustrated in FIG. 9, a layer of an adhesive 81 is disposed between the first surface of the interposer and the front surface of the chip.

The subassembly illustrated in FIG. 9 is further provided with an encapsulant 60' (FIG. 10) in the form of a layer covering substantially the entire second face 46 of interposer 42 and hence filling the apertures 54 and covering the leads 50'. The layer 60' is provided with holes 82 in alignment with the terminals 48. Holes 82 may be formed by etching layer 60', by applying layer 60' in a selective coating process such as silk screening or the like or by applying layer 60' in a selective curing process. Thus, layer 60' may be formed by an encapsulant which is curable by ultraviolet or other radiant energy. The encapsulant may be deposited over the entire interposer, and over terminals 48. After application of the encapsulant, radiant energy may be applied selectively, so that the areas of the layer overlying terminals 48 remain uncured. These layers are then removed by washing or by a relatively mild etching operation, leaving the holes 82 in alignment with terminals 48. Masses of electrically conductive bonding material 52' are deposited within holes 82 in the encapsulant layer. These masses are then engaged with the contact pads (not shown) of the substrate and heated so that bonding material 52' forms a bond between each terminal 48 and the associated contact pad on the substrate, in a manner similar to the solder bonds of the assembly depicted in FIG. 2.

As illustrated in FIG. 11, a chip 128 may have contacts 140 disposed in a peripheral arrangement, i.e., where all of the contacts 140 are disposed adjacent the periphery of the chip. The central zone of the contact pattern area, adjacent the geometric center 164 of the contact array, is devoid of contacts. With such a chip, the terminals 148 on the interposer may be arranged in a "fan in" pattern, i.e., where the mean distance from the geometric center 164 to the terminals 148 is less than the mean distance from the geometric center to the contacts 140. Some of the terminals 148 are disposed on the area of the interposer overlying the central zone of the contact pattern area, i.e., adjacent center 164. This arrangement can provide a substantially uniform distribution of terminals over an area equal to the contact pattern area, i.e., over the area encompassed by contacts 140. This provides a spacing between adjacent terminals larger than the spacing between adjacent contacts 140. This allows connection of chips with peripheral contact arrays to area arrays of contact pads on the substrate. Thus chips originally intended for conventional bonding processes such as tape automated bonding can be adapted readily and economically to substrates having compact contact pad arrays similar to those used in flip-chip bonding.

The structure illustrated in FIG. 12 has an interposer 242 with terminals 248 and leads 250 substantially as discussed above with reference to FIGS. 1–4. However, leads 250 are curved in directions parallel to the face 246 of the interposer 242 and parallel to the plane of the front face 238 of chip 228. This provides increased flexibility in lead 250. Desirably, the curved portion of each lead overlies the aperture 254. Thus, the curved portion of the lead is not bonded to the interposer 242. This portion of the lead therefore can flex to accommodate movement of contact 240 relative to terminal 248 without deformation of the interposer 242. Contacts 248 however, which are formed integrally with the leads 250 are bonded to the surface of interposer 242.

As illustrated in FIG. 14, chips 428 may be provided in the form of a wafer incorporating a plurality of chips, all of the same design or of differing designs. Individual interposers 442 may be positioned on the individual chips 428 constituting wafer 430, and the interposers may be assembled to the chips as discussed above. In this operation, the contacts on each chip 428 are secured to the leads and terminals of each interposer. After the interposers are secured to the chips, and desirably after the junctures between the leads of each interposer and the contacts of each chip are encapsulated, the individual chips are separated from the wafer and from one another, as by cutting the wafer using conventional wafer severing or "dicing" equipment commonly utilized to sever individual chips without interposers. This procedure yields a plurality of chip and interposer subassemblies, each of which may be secured to an individual substrate.

As illustrated in FIG. 15, a wafer 530 incorporating a plurality of chips may be assembled to a sheet 535 incorporating a plurality of interposers 542. Again, the contacts on each chip are secured to the terminals and leads of one individual interposer overlying the particular chip. The wafer 530 and the sheet 535 are severed after this operation, and desirably after encapsulating the leads, so as to provide individual subassemblies each including a chip and an interposer.

Interposer also may be provided in the form of a sheet 635 incorporating plural interposers such as interposer 642 and 643 at predetermined relative positions corresponding to the positions of chips on a completed assembly including a substrate. Chips such as chips 628 and 629 may be secured to the individual interposers and the entire assembly of plural chips and the sheet of plural interposers may be secured to a substrate 620. Each interposer in such an assembly desirably incorporates a pattern of terminals and leads as discussed above. This variant of the assembly procedures provides for consolidation of plural chips into a larger subassembly before bonding to the substrate.

The structures discussed above can be utilized with essentially any semiconductor chip. For example, the semiconductor chip may be formed from a material selected from the group consisting of silicon based and gallium arsenide based semiconductor materials, or from other suitable compositions. The expression "semiconductor chip" is used herein in this disclosure in the conventional sense, as referring to a chip having portions which are semiconductive so as to accomplish the required electronic functions. A wide variety of substrate materials may be employed. For example, the substrate may be formed from ceramic, polymeric and metallic structural materials, and from composites including these materials.

The interposer itself may be formed from a wide variety of materials. Flexible interposers typically are fabricated from polymeric materials such as polyimides and other thermosetting polymers, fluoro polymers and thermoplastic polymers. Also, the interposer may be a composite incorporating plural materials. The interposer may consist of, or incorporate, a foam or mesh layer. The flexibility of the interposer depends on the thickness and configuration of the interposer, as well as on the properties of the materials used therein. Thus, a flexible interposer, capable of buckling or wrinkling to accommodate relative movement, can be fabricated from high elastic modulus materials, normally considered as "rigid" provided that these materials are present in thin layers. Relatively soft materials and foams can be used in greater thicknesses and still provide a highly flexible interposer. Moreover, such soft materials and foams provide a highly compliant interposer, i.e., an interposer which is readily compressible in the directions perpendicular its surfaces and which therefore permits movement of the terminals in these directions. As discussed above with reference to FIG. 8, such compliance facilitates testing operations.

The leads and terminals can be fabricated from conventional materials of types commonly employed for semiconductor chip leads. Metals, including copper, noble metals such as gold and silver, or copper based alloy with noble metal overcoating can be employed. The terminals can also be formed from composite materials including conductive epoxies, metal filled polymers or intrinsically conducting polymeric compositions such as polyacetylene. The terminals can also be formed from alloys commonly regarded as soldering or brazing alloys such as lead-tin, gold-tin or silver-copper alloys.

The encapsulant desirably is a soft material having a very low elastic modulus. The encapsulant may have properties similar to those of rubber, gum or gel.

As discussed above, the leads, and desirably the interposer itself, are flexible so as to permit movement of the contact ends of the leads relative to the terminals without imposing substantial forces on the juncture between the contact ends of the leads and the contacts on the chip, or on the bonding material securing the terminals to the contact pads of the substrate. The minimum degree of flexibility required in a given application vary with the properties of the materials employed and with the temperatures expected in service. Desirably, however the forces required to bend or deform the leads will not cause early thermal cycling damage of the joints between the contact ends of the leads and the chip contacts, or the fatigue limits of the bonding materials. A conservative design approach is to assume the maximum temperature changes to be encountered in service and the maximum temperature differentials between components (such as between the chip and substrate) expected in service with safety margins as commonly employed in the semi-conductor industry Based upon these assumptions, the maximum possible relative movement between any chip contact and any contact pad on the substrate can be calculated according to commonly used finite element analysis methods. The stress for leads of various flexibilities can then be compared to known data for maximum thermal stress on metallurgical bonds of a particular type, and the appropriate design may be selected. Preferably, however, leads of various flexibilities are fabricated and tested.

As will be appreciated, numerous variations and combinations of the features discussed above can be utilized without departing from the present invention as defined by the claims. Accordingly, the forgoing description of the preferred embodiment should be taken by way of illustration rather than by way of limitation of the invention.

What is claimed is:

1. A method of assembling a semiconductor chip comprising the steps of:
   (a) assembling a flexible sheetlike dielectric interposer formed separately from the chip and having first and second surfaces to the chip so that a first surface of said interposer confronts a front surface of said chip, so that said first surface of said interposer bears on said front surface of said chip and so that a portion of said interposer overlies a contact pattern area encompassed by a pattern of contacts on the front surface of said chip; and
   (b) connecting the contacts on said chip to terminals disposed on the second surface of said interposer within an area of said interposer overlying said contact pattern area by means of flexible leads so that such leads extend between the contacts and terminals through apertures in said interposer and so that each such terminal is moveable with respect to the associated contact.

2. A method as claimed in claim 1 wherein said interposer has said terminals positioned thereon prior to said step of assembling said interposer to said chip.

3. A method as claimed in claim 2 wherein said interposer also has said leads positioned thereon and connected to said terminals prior to said step of assembling said interposer to said chip.

4. A method as claimed in claim 1 wherein said step of connecting said contacts to said terminals includes the step of bonding said leads to said contacts on said chip in said apertures by inserting a tool through said apertures.

5. A method as claimed in claim 1 further comprising the step of testing the assembled chip and interposer after said step of connecting said terminals to said contacts, said testing step including the step of making temporary electrical connections to said terminals.

6. A method as claimed in claim 5 wherein said step of making said temporary electrical connections includes the step of pressing probes against said terminals, said interposer being complaint, said interposer being deformed during said pressing step.

7. A method as claimed in claim 1 further comprising the step of applying a dielectric encapsulant so as to cover said flexible leads after said leads are connected to said contacts on said chip.

8. A method as claimed in claim 7 wherein said step of applying an encapsulant is performed so that said encapsulant extends into said apertures in said interposer.

9. A method as claimed in claim 7 wherein said step of applying an encapsulant is performed by applying said encapsulant in discrete portions so as to cover the junctures of said leads with said contacts on said chip but leave said terminals exposed.

10. A method as claimed in claim 9 wherein said step of applying an encapsulant includes the steps of applying a layer of said encapsulant on said second surface of said interposer and forming holes in said layer so that said terminals are exposed in said holes.

11. A method as claimed in claim 1 further comprising the step of manipulating said assembled interposer and chip by said interposer.

12. A method as claimed in claim 11 wherein said interposer is provided in the form of a tape, said step of assembling said chip to said interposer being performed so as to assemble a plurality of chips to said tape, said step of manipulating said chip including the step of advancing said tape so as to convey said chips with said advancing tape.

13. A method as claimed in claim 1 wherein said assembling and connecting steps are performed while said chip is present in a wafer incorporating a plurality of chips so as to assemble said plurality of chips to a plurality of interposers and connect the contacts of each such chip to the terminals on one of said interposers.

14. A method as claimed in claim 13 further comprising the step of severing said plurality of chips from one another after said assembling step.

15. A method as claimed in claim 14 wherein said plurality of interposers are initially connected to one another and said severing step includes the step of severing said connected interposers from one another.

16. A method as claimed in claim 1 wherein a plurality of interposers are provided as a sheetlike assemblage, said assembling and connecting steps including the steps of assembling one chip to each interposer in said sheetlike assemblage and connecting each such chip to the contacts on the interposer assembled herewith.

17. A method as claimed in claim 1 further comprising the steps of assembling a substrate with said interposer so that contact pads on a top surface of said substrate confront the terminals on said interposer and bonding said terminals to said pads.

18. A method as claimed in claim 17 wherein said step of bonding said terminals to said pads on said substrate includes the step of fusing a mass of electrically conductive material between each said terminal and the associated one of said pads.

19. A method as claimed in claim 18 wherein said electrically conductive material is a solder, the method further comprising the steps of providing a flux for said solder so that said flux is present during said fusing step and removing said flux after said fusing step, said masses supporting said interposer and chip on said substrate so that there is a gap between said second surface of said interposer and the top surface of said substrate, said step of removing said flux including the step of applying a rinsing fluid in said gap.

20. A method of making a semiconductor connection component comprising the steps of:
   (a) providing a sheetlike dielectric interposer having first and second surface and a plurality of apertures extending between said surfaces;
   (b) laminating a conductive sheet to said second surface of said interposer, so that a first surface of said sheet confronts said second surface of said interposer and so that said sheet overlies said apertures;
   (c) forming a resist pattern on a second surface of said sheet facing away from said interposer, said resist pattern including lead areas at least partially aligned with said apertures and terminal areas contiguous with said lead areas but not aligned with said apertures;
   (d) applying a resist to the first surface of said conductive sheet in said apertures;
   (e) contacting said conductive sheet with an etchant so that said etchant removes said conductive sheet except in said lead areas and said terminal ares; and
   (f) removing said resists.

21. A method as claimed in claim 20 wherein said step of applying a resist to the first surface is performed by laminating a sheet of resist to said first surface of said interposer so that the resist of said sheet fills said apertures.

* * * * *

UNITED STATES PATENT AND TRADEMARK OFFICE
CERTIFICATE OF CORRECTION

PATENT NO. : 5,346,861
DATED : September 13, 1994
INVENTOR(S) : Khandros et al

It is certified that error appears in the above-indentified patent and that said Letters Patent is hereby corrected as shown below:

Column 2, line 31, delete the comma (,) after pattern and insert a period (.)
Column 15, line 13 insert a period (.) after industry.
Column 16, line 2, change "complaint" to read -- compliant --.
Column 18, line 7, change "ares" to read -- areas --.

Signed and Sealed this

Seventh Day of February, 1995

Attest:

BRUCE LEHMAN

*Attesting Officer*    Commissioner of Patents and Trademarks